(12) United States Patent
Breitlow et al.

(10) Patent No.: US 10,690,705 B2
(45) Date of Patent: Jun. 23, 2020

(54) POWER CONVERTER FOR A THERMAL SYSTEM

(71) Applicant: WATLOW ELECTRIC MANUFACTURING COMPANY, St. Louis, MO (US)

(72) Inventors: Stanton H. Breitlow, Winona, MN (US); John Lemke, Houston, MN (US); James Hentges, Winona, MN (US); Keith Ness, Winona, MN (US); Eric Ellis, Columbia, MO (US); William Bohlinger, Winona, MN (US); Matthew Yender, Winona, MN (US); Dean R. McCluskey, Winona, MN (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 257 days.

(21) Appl. No.: 15/624,060

(22) Filed: Jun. 15, 2017

(65) Prior Publication Data
US 2017/0363663 A1     Dec. 21, 2017

Related U.S. Application Data

(60) Provisional application No. 62/350,275, filed on Jun. 15, 2016.

(51) Int. Cl.
*F24D 11/02*    (2006.01)
*G01R 19/22*    (2006.01)
(Continued)

(52) U.S. Cl.
CPC ........ *G01R 19/225* (2013.01); *F24D 11/0207* (2013.01); *G01R 19/16519* (2013.01);
(Continued)

(58) Field of Classification Search
CPC .......... F24D 11/0207; G01R 19/16519; G01R 19/225; G01R 19/257; H01L 21/67115; H01L 21/67248; H05B 1/0233
(Continued)

(56) References Cited

U.S. PATENT DOCUMENTS 4,540,866 A * 9/1985 Okuda .................. H05B 6/062
219/626
7,196,295 B2 * 3/2007 Fennewald ......... B29C 45/2737
219/212

(Continued)

FOREIGN PATENT DOCUMENTS

CN       102340254      2/2012
EP       1126591        8/2001
(Continued)

OTHER PUBLICATIONS

Duty-cycle is one key to buck converters' output current capability _ EE Times (Year: 2003).*
(Continued)

*Primary Examiner* — Tu B Hoang
*Assistant Examiner* — Tiffany T Tran
(74) *Attorney, Agent, or Firm* — Burris Law, PLLC

(57) ABSTRACT

The present disclosure generally describes a system that includes a heater, a power converter including a power switch, and a controller. The power converter is in communication with the heater and is operable to apply an adjustable voltage to the heater. The controller is in communication with the power switch to control the voltage output of the power converter based on at least one of a load current and a detected voltage at the heater. The controller operates the power switch to adjust the voltage output of the power converter.

21 Claims, 7 Drawing Sheets

(51) Int. Cl.
- *H01L 21/67* (2006.01)
- *H05B 1/02* (2006.01)
- *G01R 19/165* (2006.01)
- *G01R 19/257* (2006.01)

(52) U.S. Cl.
CPC ...... *G01R 19/257* (2013.01); *H01L 21/67115* (2013.01); *H05B 1/0233* (2013.01); *Y02B 30/17* (2018.05)

(58) Field of Classification Search
USPC ......... 219/204, 488, 494, 660–665; 392/411, 392/416
See application file for complete search history.

(56) References Cited

U.S. PATENT DOCUMENTS

| | | | |
|---|---|---|---|
| 7,257,464 B2 * | 8/2007 | Fennewald | G05D 23/1917 219/494 |
| 8,064,233 B2 * | 11/2011 | Ishizu | H01L 21/67248 219/663 |
| 8,593,115 B2 | 11/2013 | Walter et al. | |
| 9,041,377 B2 | 5/2015 | Wang et al. | |
| 9,241,378 B2 | 1/2016 | Lee et al. | |
| 9,293,984 B2 | 3/2016 | Komiya et al. | |
| 9,312,776 B2 | 4/2016 | Freeman et al. | |
| 2004/0008016 A1 | 1/2004 | Sutardja et al. | |
| 2004/0039487 A1 * | 2/2004 | Fennewald | G05D 23/1917 700/278 |
| 2004/0069769 A1 * | 4/2004 | Carr | G05D 23/2401 219/497 |
| 2005/0029993 A1 * | 2/2005 | Hadizad | H01L 27/0605 323/223 |
| 2005/0109767 A1 * | 5/2005 | Fennewald | B29C 45/2737 219/543 |
| 2009/0289575 A1 * | 11/2009 | Eisenbeis | G01R 15/22 315/291 |
| 2010/0033146 A1 * | 2/2010 | Irissou | H02M 3/156 323/282 |
| 2011/0174801 A1 | 7/2011 | Schwerman | |
| 2011/0206358 A1 | 8/2011 | Goldin et al. | |
| 2011/0216560 A1 | 9/2011 | Ye | |
| 2013/0098895 A1 * | 4/2013 | Swanson | H05B 3/20 219/508 |
| 2013/0287377 A1 * | 10/2013 | Serebryanov | H01L 21/67115 392/411 |
| 2014/0159693 A1 | 6/2014 | Kuang et al. | |
| 2016/0105126 A1 | 4/2016 | Sunahara et al. | |
| 2016/0196992 A1 * | 7/2016 | Serebryanov | F27B 17/0025 219/488 |
| 2017/0093275 A1 | 3/2017 | Xie et al. | |
| 2017/0099011 A1 | 4/2017 | Freeman et al. | |

FOREIGN PATENT DOCUMENTS

| | | |
|---|---|---|
| EP | 1402310 | 3/2004 |
| EP | 1532501 | 5/2005 |
| EP | 1603218 | 12/2005 |
| EP | 1801960 | 6/2007 |
| EP | 2404359 | 1/2012 |
| EP | 2606551 | 6/2013 |
| EP | 2667481 | 11/2013 |
| EP | 2876801 | 5/2015 |
| EP | 2879471 | 6/2015 |
| EP | 2904697 | 8/2015 |
| EP | 3097635 | 11/2016 |
| EP | 3128662 | 2/2017 |
| EP | 3130708 | 2/2017 |
| TW | I287912 | 10/2007 |
| TW | I504847 | 10/2015 |
| WO | 2001/052602 | 7/2001 |
| WO | 2002/093730 | 11/2002 |
| WO | 2010/007771 | 1/2010 |
| WO | 2010/086946 | 8/2010 |
| WO | 2012/032589 | 3/2012 |
| WO | 2015/016885 | 2/2015 |
| WO | 2016/069803 | 5/2016 |

OTHER PUBLICATIONS

WO2015016885 (Year: 2015).*
International Search Report for International Application PCT/US2017/037703, dated Sep. 1, 2017.
International Search Report for International Application PCT/US2018/046195, dated Oct. 11, 2018.

* cited by examiner

5% Conduction

25% Conduction

50% Conduction

5% Conduction

25% Conduction

50% Conduction

POWER CONVERTER FOR A THERMAL SYSTEM

CROSS-REFERENCE TO RELATED APPLICATIONS

This application claims the benefit of and priority to U.S. Provisional Application No. 62/350,275 filed on Jun. 15, 2016. The disclosure of the above application is incorporated herein by reference.

FIELD

The present disclosure relates to thermal systems and more particularly, to thermal systems having varied power.

BACKGROUND

The statements in this section merely provide background information related to the present disclosure and may not constitute prior art.

Generally, a pedestal heater is a semiconductor processing tool for heating a wafer disposed thereon. The pedestal heater includes a heating plate and a support shaft disposed under the heating plate. The heating plate may include a ceramic substrate and a plurality of resistive heating elements embedded in the ceramic substrate to define a plurality of heating zones. Typically, the same power is applied to the plurality of resistive heating elements at the same ramp rate during heater startup.

Despite the same power applied to the resistive heating elements, some resistive heating elements may be heated faster than the other heating elements due to, for example, the position of the heating zones relative to heat sinks, and differences in the characteristics of the heating zones caused by non-uniform manufacturing. When a heating zone is heated faster than an adjacent heating zone, the temperature difference between the adjacent heating zones causes different thermal expansion and consequently thermal stress between the adjacent heating zones. Significant thermal stress may result in generation of thermal cracks in the ceramic substrate.

SUMMARY

In one form, the present disclosure provides for a thermal system including a heater, a power converter including a power switch, and a controller. The power converter is in in communication with the heater, and is operable to apply an adjustable voltage to the heater. The controller is in communication with the power switch to control the voltage output of the power converter based on at least one of a current and a voltage at the heater. The controller operates the power switch to adjust the voltage output of the power converter. In one form, the controller controls the voltage of the power converter based on a temperature of the heater, where the temperature is determined based on a resistance of the heater, which is determined by the voltage and the current of the heater.

In another form, the present disclosure provides for a thermal system including a heater having a plurality of heating elements, a plurality of power converters, and a controller. Each power converter is a step-down voltage converter that includes a power switch. A given power converter is in communication with one or more heating elements among the plurality of heating elements, and the power converters are operable to apply an adjustable voltage to the respective one or more heating elements. The controller is in communication with the power switches of the power converters to control the voltage output of the power converters based on at least one of current and voltage at the heater. The controller operates a given power switch to adjust the voltage output of the respective power converter.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 5A:
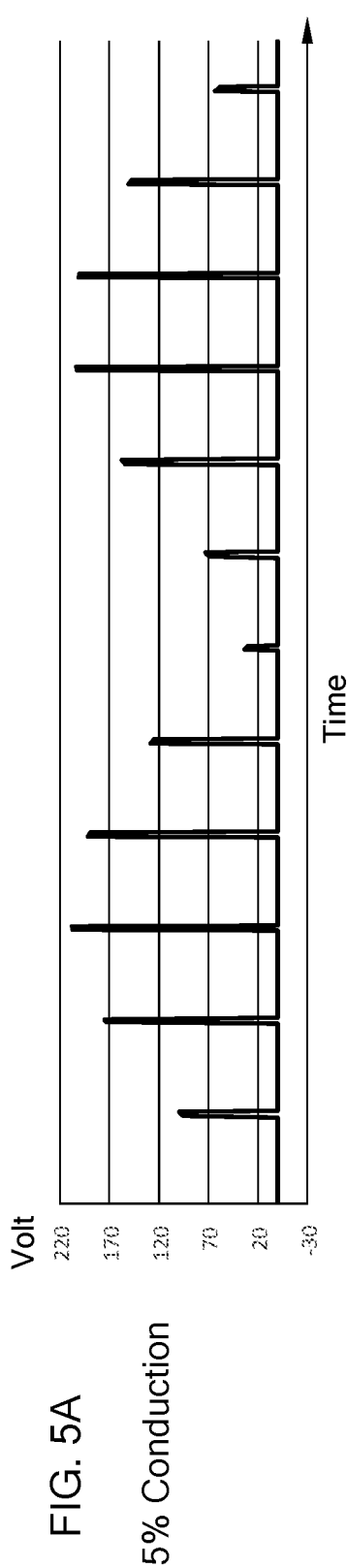
Figure 5B:
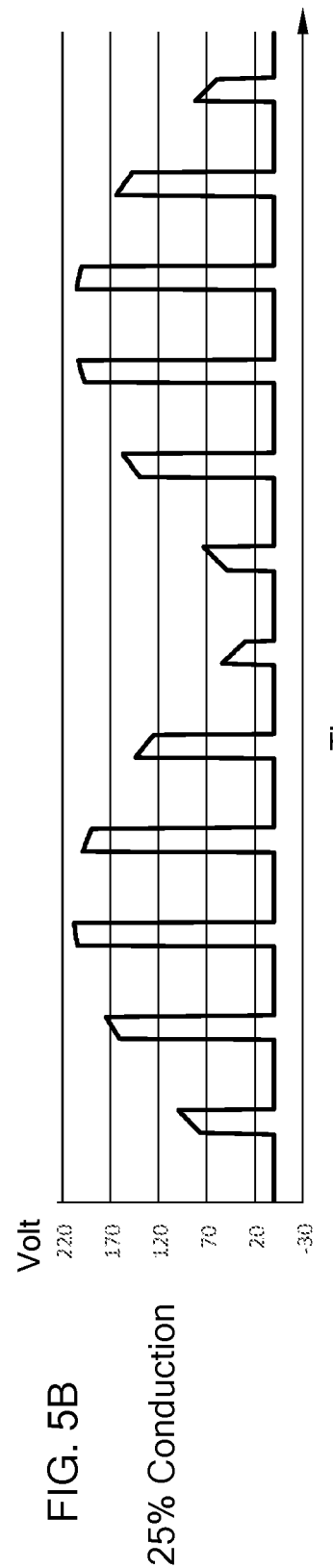
Figure 5C:
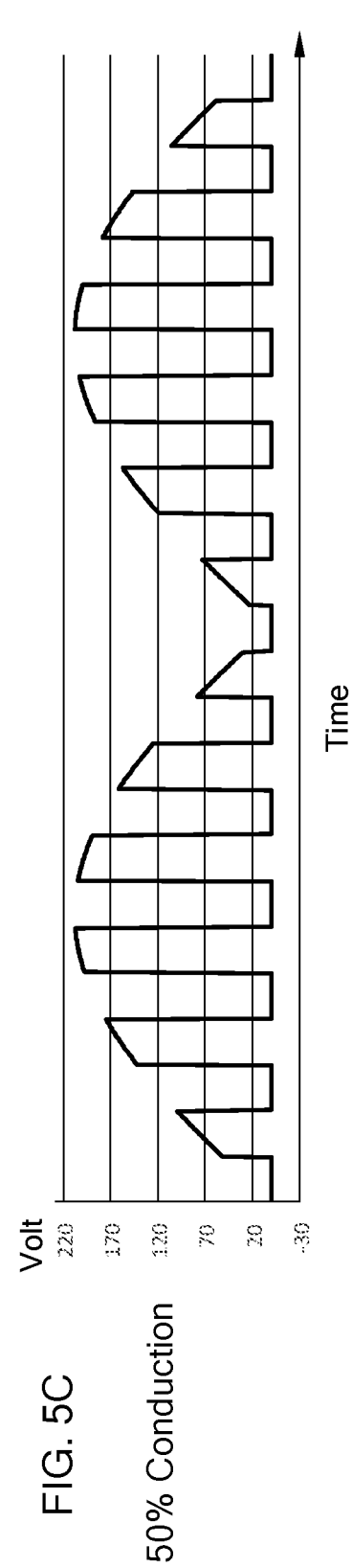
Figure 6A:
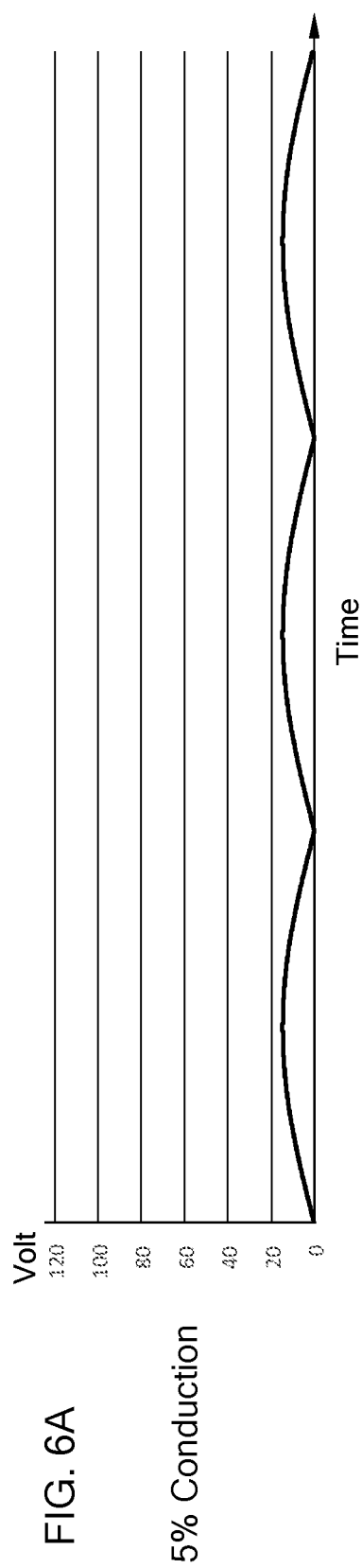
Figure 6B:
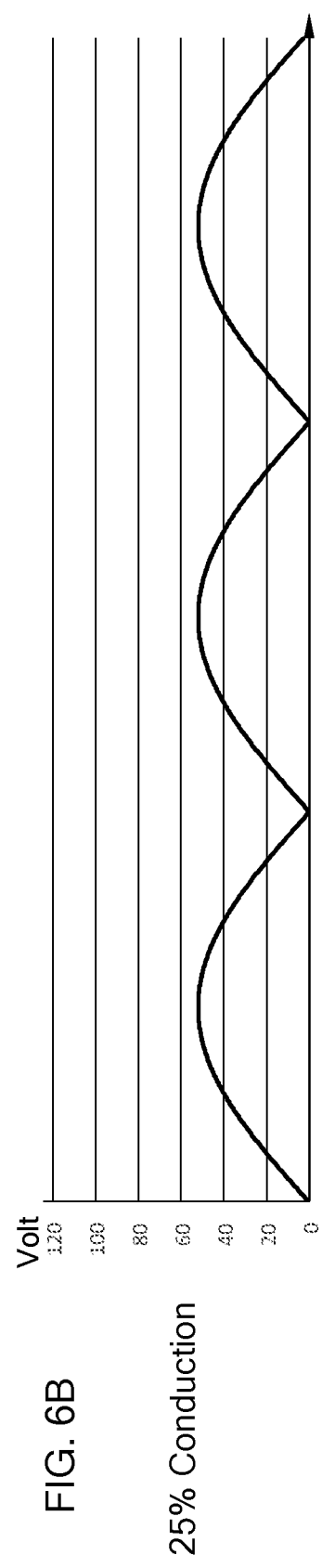
Figure 6C:
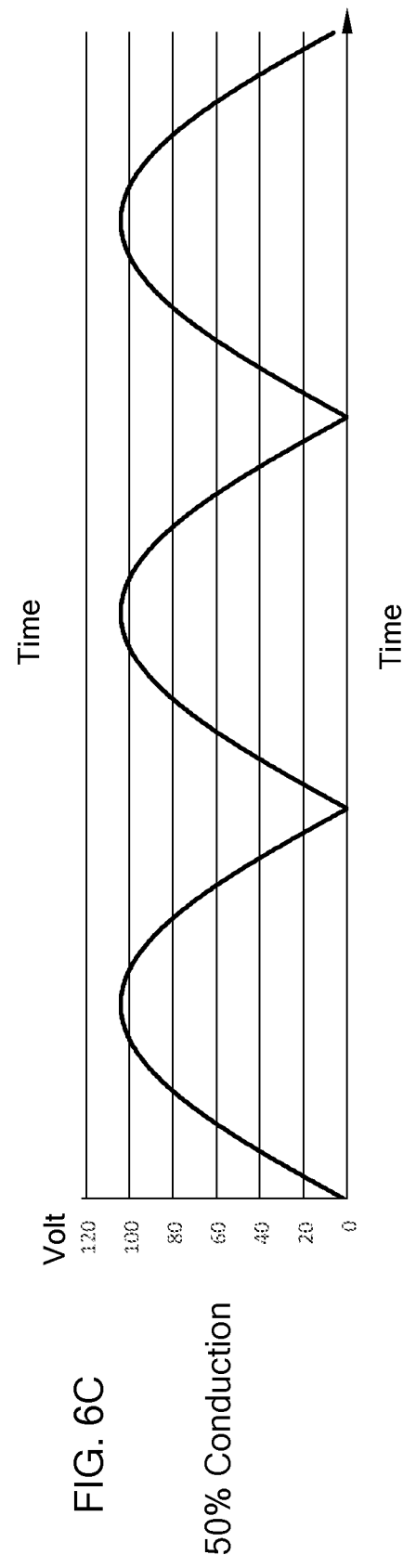
Figure 7A:
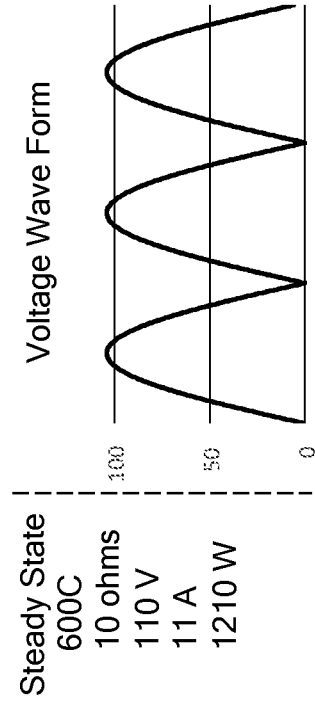
Figure 7B:
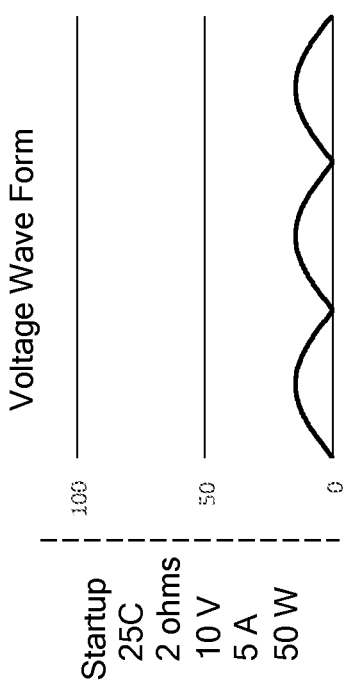
Figure 7C:
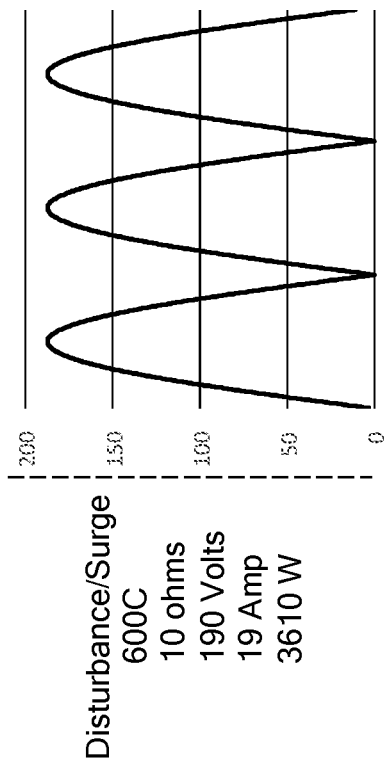
Figure 7D:
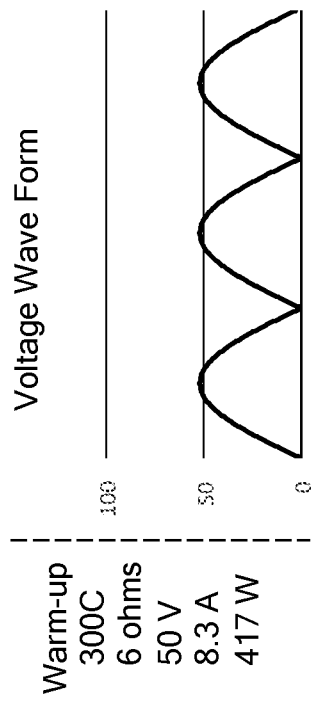

FIGS. 5A, 5B, and 5C illustrate waveforms of drive signals having different conduction rates in accordance with the teachings of the present disclosure;

FIGS. 6A, 6B, and 6C illustrate waveforms of output voltages of the power converter based on the waveforms of FIGS. 5A, 5B, and 5C, respectively, in accordance with the teachings of the present disclosure; and FIGS. 7A, 7B, 7C, and 7D illustrate waveforms of different output voltages of the power converter based on different input conditions in accordance with the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 1:
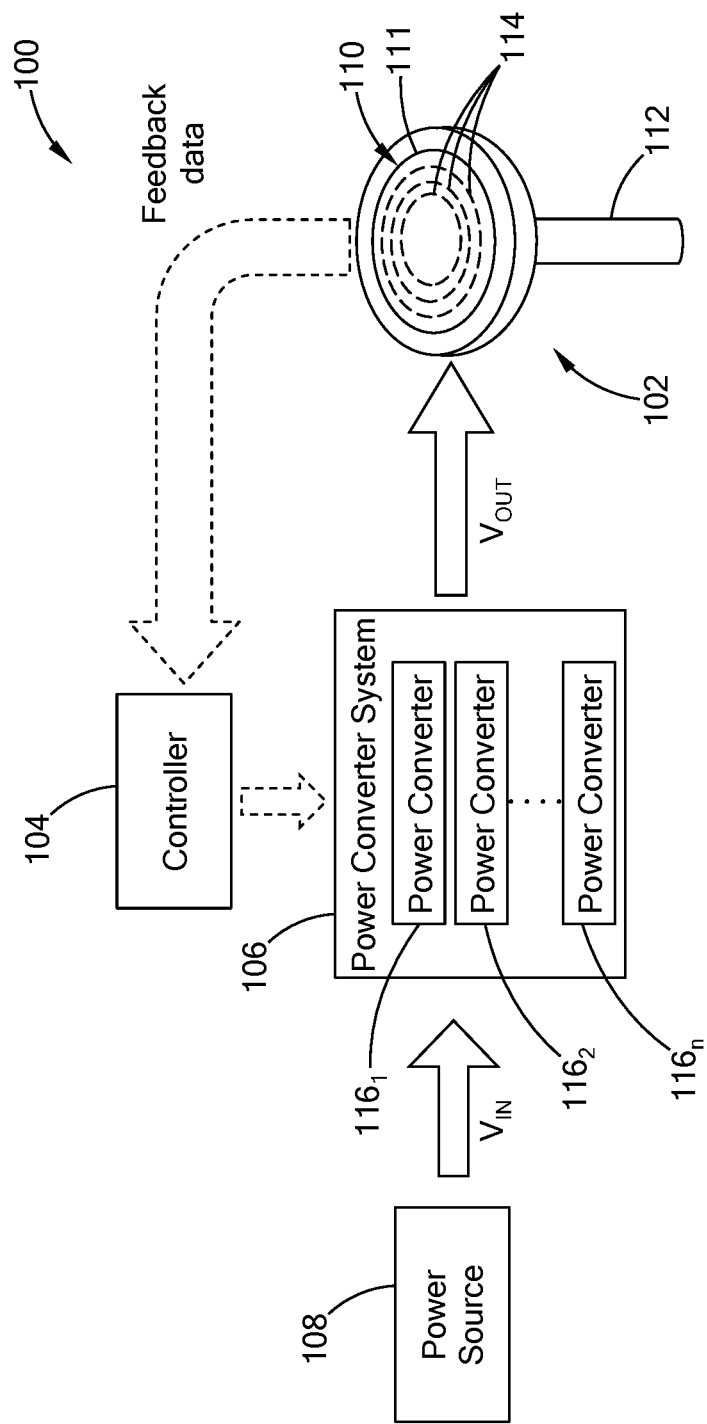
FIG. 1 is a block diagram of an electrical thermal system in accordance with the teachings of the present disclosure.

Referring to FIG. 1, a thermal system 100 constructed in accordance with the teachings of the present disclosure includes a heater 102, a controller 104 (i.e., a control module), and a power converter system 106. The controller 104 and the power converter system 106 control the power supplied to the heater 102 from a power source 108. More particularly, the controller 104 and the power converter system 106 operate as a control system for monitoring and if needed, adjusting the power supplied to the heater 102. As described in detail below, the controller 104 receives feedback data from the heater 102 to determine if power to any of the heater zones of the heater 102 is to be adjusted, and if so, adjusts the power by transmitting signals to the power converter system 106 to have one or more power converters output a controlled voltage to respective heater zones of the heater 102.

In one form of the present disclosure, the heater 102 is a pedestal heater including a heating plate 110 and a support shaft 112 disposed at a bottom surface of the heating plate 110. The heating plate 110 includes a substrate 111 and a plurality of resistive heating elements (not shown) embedded in the substrate 111 in one form of the present disclosure. The resistive heating elements may also be disposed on at least one surface of the substrate 111 while remaining within the scope of the present disclosure. The substrate 111 may be made of ceramics or aluminum. The resistive heating elements are independently controlled by the controller 104 and define a plurality of heating zones 114 as illustrated by the dotted lines in the figure. It should be understood that these heating zones 114 are merely exemplary and could take on any configuration while remaining within the scope of the present disclosure.

The resistive heating elements can be configured in various suitable ways. For example, in one form of the present disclosure, each of the resistive heating elements is connected to a first power pin and a second power pin to define a first junction and a second junction, respectively. The first and second power pins are connected to wires which extend from the heating plate 110 through the support shaft 112 of the heater 102 to the controller 104. The first and second power pins function as thermocouple sensing pins for measuring temperature of the heater 102. Using the power pins as a thermocouple to measure a temperature of a resistive heating element has been disclosed in co-pending application, U.S. Ser. No. 14/725,537, filed May 29, 2015 and titled "RESISTIVE HEATER WITH TEMPERATURE SENSING POWER PINS," which is commonly owned with the present application and the contents of which are incorporated herein by reference in its entirety. Generally, the controller 104, which is in communication with the first and second power pins, is configured to measure changes in voltage at the first and second junctions. More specifically, the controller 104 measures millivolt (mV) changes at the junctions and then uses these changes in voltage to calculate an average temperature of the resistive heating element. In one form, the controller 104 may measure changes in voltage at the junctions without interrupting power to the resistive heating element. This may be accomplished, for example, by taking a reading at the zero crossing of an AC input power signal. In another form, power is interrupted and the controller 104 switches from a heating mode to a measuring mode to measure the changes in voltage. Once the average temperature is determined, the controller 104 switches back to the heating mode.

The heater 102 may be configured in various suitable ways, and is not limited to the two pin resistive heating elements. For example, the heater 102 may be a "two-wire" heater such that changes in resistance can be used by the controller 104 to determine temperature. Such a two-wire system is disclosed in U.S. Pat. No. 7,196,295, which is commonly owned with the present application and the contents of which are incorporated herein by reference in their entirety. In a two-wire system, the thermal system is an adaptive thermal system that merges heater designs with controls that incorporate power, resistance, voltage, and current in a customizable feedback control system that limits one or more these parameters (i.e., power, resistance, voltage, current) while controlling another. The controller 104 is configured to monitor at least one of current, voltage, and power delivered to the heater over a period time to acquire stable continuous current and voltage readings. These readings can then be used for determining resistance, and thus, temperature of the heater. Alternately, the controller 104 may be coupled to discrete temperature and/or resistance sensor(s) (e.g., a separate thermocouple).

The power converter system 106 include a plurality of power converters 116 ($116_1$ to $116_n$ in figures). One or more power converters 116 are connected to heating elements of a heating zone of the heater 102 to supply voltage to the heating elements. As described further below, each power converter 116 is operable to adjust an input voltage ($V_{IN}$) from the power source 108 to an output voltage ($V_{OUT}$) that is applied to the heating elements of the heater 102, where the output voltage is less than or equal to the input voltage.

The controller 104 includes electronics including microprocessor and memory, and is configured to control the power supplied to the resistive heating elements of the heater 102 by the power converter system 106. As described further below, the controller 104 operates the power converter system 106 to adjust the voltage applied to the heater 102 based on feedback data from the heater 102 and pre-stored control algorithms and/or processes. In one form of the present disclosure, an input voltage from the power source 108 is scaled using a scaling factor, such as that disclosed in U.S. Pat. Nos. 7,257,464 and 8,423,193, which are commonly assigned with the present application and the contents of which are incorporated herein by reference in their entirety. The input voltage can be scaled based on a preset user value. The preset user value is one of maximum voltage output level and maximum power output level, or generally may be current, voltage, or wattage. The current is measured simultaneously with scaling the voltage and providing power to the heater. The scaling comprises a gradual ramp-up, or a ramping function, to detect heater characteristics during the ramp-up. The heater characteristics include one of low heater resistance and a heater short. In another form, the controller 104 determines resistance of the heater 102 for scaling the input voltage based on the control algorithm.

Figure 2:
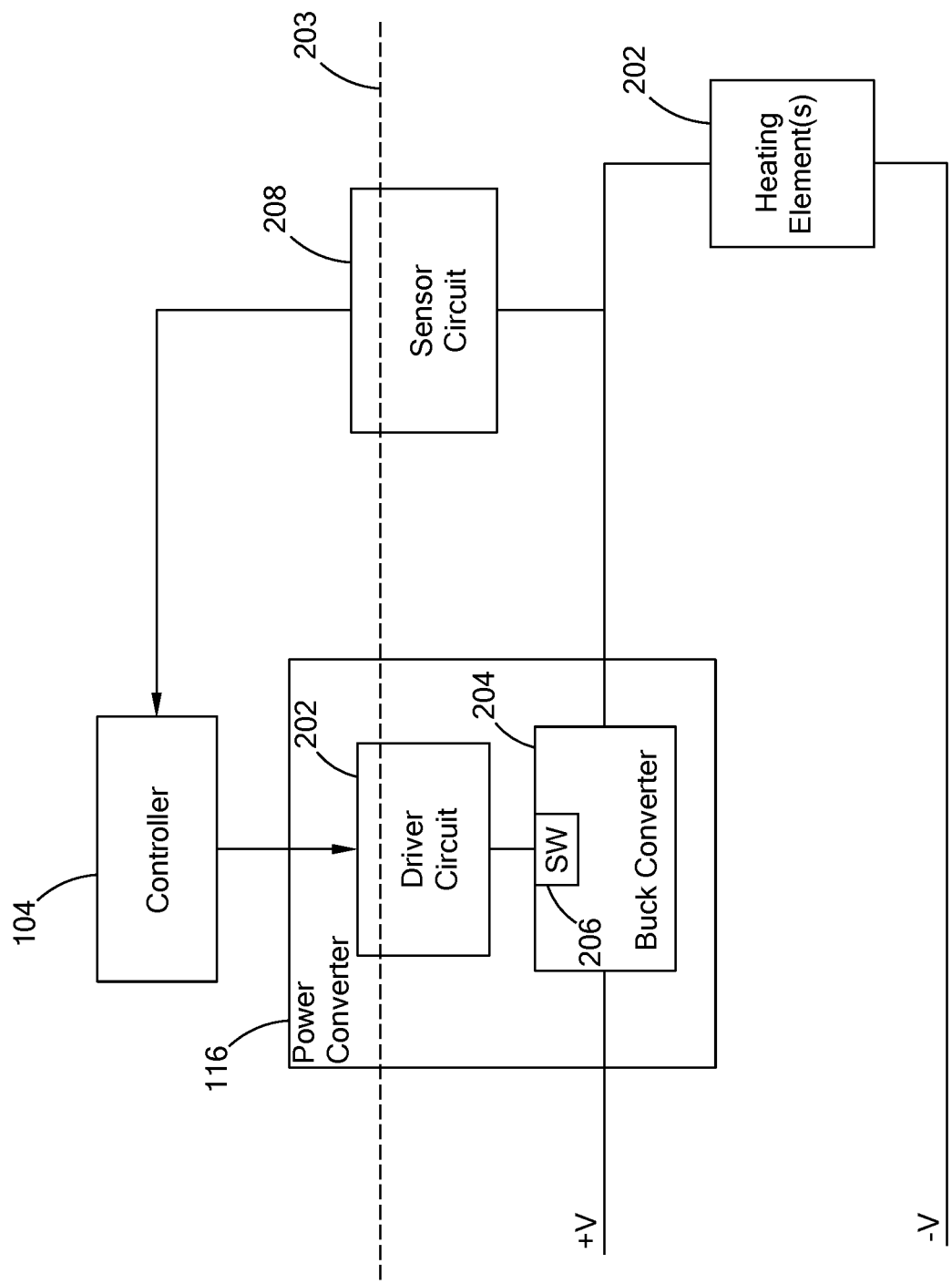
FIG. 2 is a block diagram of a power converter of the electrical thermal system of FIG. 1 in accordance with the teachings of the present disclosure.

Referring to FIG. 2, the system 100 includes electronic components, such as the controller 104 that operate at a lower voltage than, for example, the power converters 116. Accordingly, to protect the low voltage components from high voltage, the system 100 includes electronic components that isolate the low voltage components from the high voltage components and still allow the components to exchange signal. For purposes of illustration, a dashed line 203 represents the isolation of a low voltage section from a high voltage section of the system 100.

A given power converter 116 includes a driver circuit 202 and a buck converter 204 having a control switch 206 ("SW" in figure), which may also be referred to as a power switch. The driver circuit 202 operates the control switch 206 based on an input signal from the controller 104. The driver circuit 202 includes electronics, such as an opto-isolator, or a transformer, among others, to communicate with the controller 104 and isolate the controller 104 from the power converter 116.

Generally, the buck converter 204, as a step-down voltage converter, is operable to decrease the voltage of the power source 108. In particular, the AC voltage from the power source 108 (e.g., 208 VAC) is rectified to a rectified AC voltage signal that is then received by the buck converter 204. Based on the operation of the control switch 206, the buck converter 204 decreases the voltage and increases the current from the power source 108 and applies the adjusted voltage and current to respective heating elements 207 of the heater 102. To reduce voltage ripple, filters made of capacitors or a combination of capacitor and inductors are added to the output and/or the input of the buck converter 204.

The system 100 further includes a sensor circuit 208 that transmits signals indicative of the performance of the heater 102 to the controller 104. The sensor circuit 208 may include electronics, such as isolated analog-to-digital converters, opto-isolators, or transformers, among others, for transmitting signals between the low and high voltage sections of the system. In one form of the present disclosure, the sensor circuit 208 includes a current sense resistor, a voltage sense resistor, and a transistor for shunting the current sense resistor to carry the load current when the control switch 206 is in predetermined state. The current sense resistor, the voltage sense resistor, and the transistor are coupled to the buck converter 204 of the power converter 116. The sensor circuit 208 measures at least one of current or voltage applied to the heating elements by the buck converter 204, and transmits the data as feedback to the controller 104, which in return determines the desired output voltage of the power converter 116.

Figure 3:
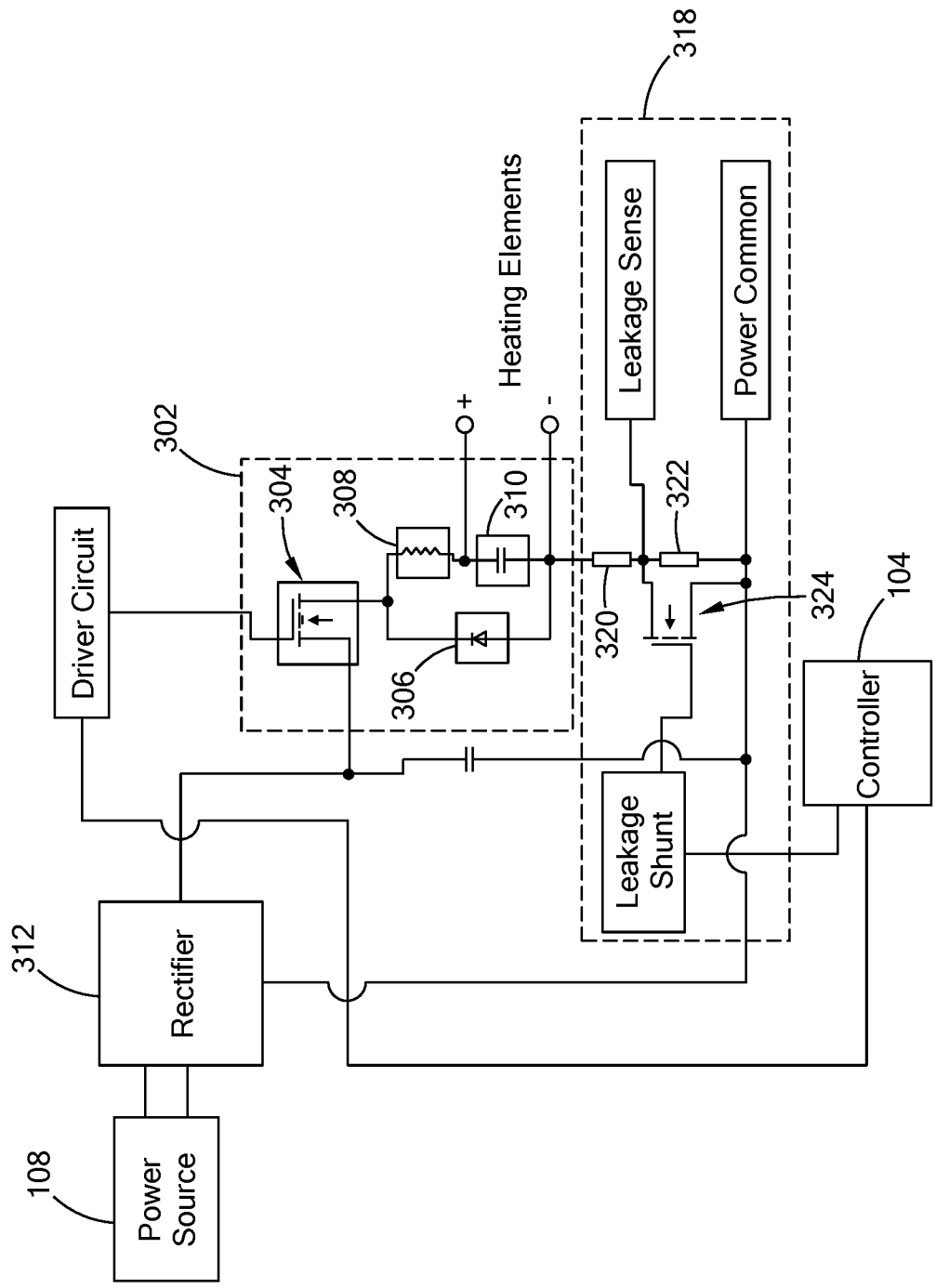
FIG. 3 is a schematic diagram of the power converter of FIG. 2 in accordance with the teachings of the present disclosure.

Referring to FIG. 3, an example schematic diagram of the power converter 116 having a buck converter 302 is illustrated. The buck converter 302 includes a transistor 304 (e.g., field effect transistor), a diode 306, an inductor 308, and a capacitor 310. The transistor 304 is operable as a switch to control the flow of current through the buck converter 302. Generally, a transistor includes a control terminal and based on a voltage applied to the control terminal, the transistor can operate as a closed switch to have electric current flow through a conducting channel between the source and drain regions of the transistor or as an open switch in which no current flows through the conducting channel. An N-type transistor performs as an open switch when no voltage is applied to the control terminal and as a closed switch when voltage (e.g., 5V) is applied. Alternatively, a P-type transistor performs as an open switch when voltage is applied to the control terminal, and as a closed switch when no voltage is applied to the control terminal. While the transistor 304 is illustrated as an N-type transistor, the transistor 304 may also be a P-type.

The buck converter 302 receives a rectified voltage from a rectifier 312 that is coupled to the power source 108, and applies an output voltage to the heating elements. Generally, when the transistor 304 is in a closed state (i.e., closed switch), the buck converter 302 is electrically coupled to the rectifier 312 such that current through the buck converter 302 begins to increase. An opposing voltage is generated across the inductor 308 terminals that counteracts the voltage from the rectifier 312, thereby reducing the net voltage across the terminals of the heating elements. Overtime, the rate of change of current begins to decrease, thus decreasing the voltage across the inductor 308 and increasing the voltage applied to the terminals of the heating elements. When the transistor 304 is in the open state (i.e., open switch), the buck converter 302 is electrically decoupled from the rectifier 312 and the inductor 308 begins to discharge causing a voltage drop across the inductor 308 and operating as a current source. Specifically, the magnetic field generated by the inductor 308 supports the current flowing through the terminals of the heating elements.

FIG. 3 also illustrates an example of a sensor circuit 318 that includes a current sense resistor 320, a leakage sense resistor 322 and a field effect transistor (FET) 324 for shunting the leakage sense resistor 322. The sensor circuit 318 is in communication with the controller 104 and provide data indicative of, for example, phase voltage and root mean square (RMS) value of the current applied to the one or more heating elements coupled to the buck converter 302.

Figure 4:
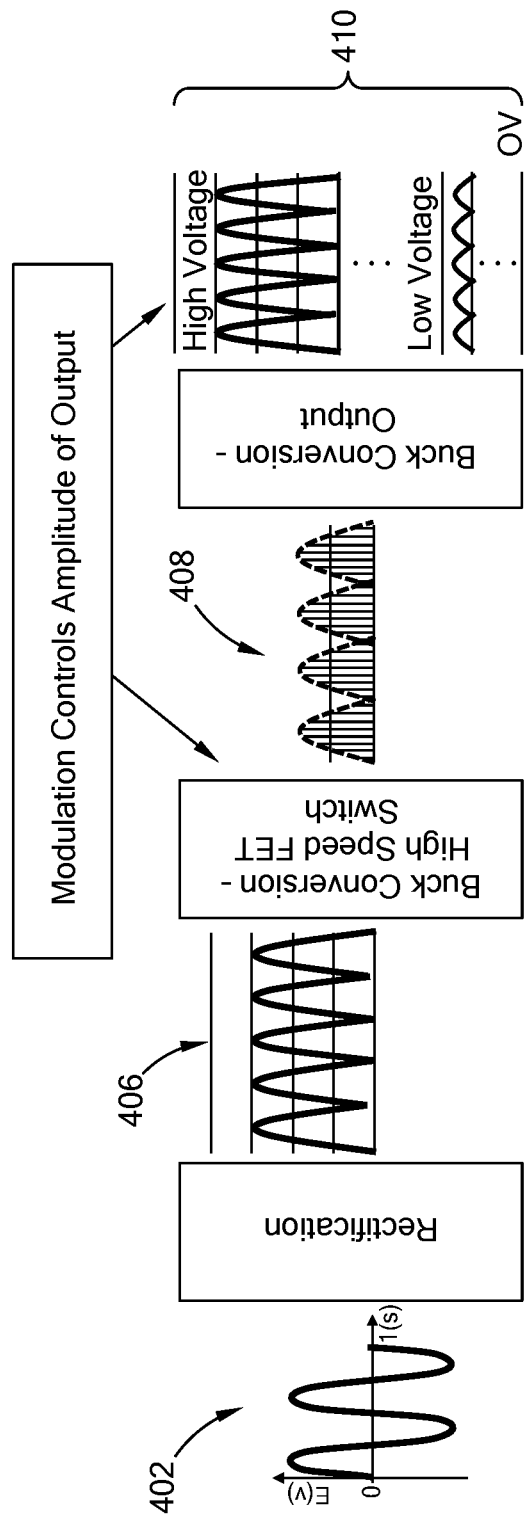
FIG. 4 is schematic diagram illustrating power conversion of an input voltage waveform in accordance with the teachings of the present disclosure.

Referring to FIG. 4, an example power conversion of an input signal from a power source through the system 100 is illustrated. An AC voltage 402 is converted to a rectified AC voltage signal 406 with ripples by way of passive or active rectifier. The rectified AC voltage signal 406 is selectively applied to the buck converter by the transistor, which is being switched driven by the controller 104. The buck converter outputs a voltage in a form of a plurality of pulses 408. Based on the information from the heater 102 and the operational state of the heater 102, the buck converter is operable to output a variable voltage 410 between a maximum voltage (e.g., 208) and a minimum voltage (e.g., 0V). Accordingly, the thermal system 100 independently controls the voltage applied to the heating elements, such that the voltage applied to one or more heating elements may be different from other heating elements.

The pulse width of the drive signal applied to the transistor controls the output voltage of the buck converter. Specifically, the amplitude of the output voltage depends on a conduction rate (i.e., duty cycle) of the transistor. The smaller the conduction rate, the smaller the amplitude of the output voltage. For example, FIGS. 5A-5C illustrate drive waveforms for the transistor at different conduction rates (e.g. 5%, 25%, and 50%), and FIGS. 6A-6C illustrate expected output voltages of the buck converter based on the drive waveforms of FIGS. 5A-5C. When a modulated drive signal having a 50% conduction rate is applied to the transistor, the buck converter outputs a voltage that is greater than a voltage outputted with a drive signal having a 5% conduction rate. Accordingly, by controlling the pulse width of the drive signal, the controller 104 controls the output voltage of the power converter 116 and thus, independently controls the voltage applied to heating elements.

The controller 104 determines the desired output voltage of a given power converter 116 based on at least one of temperature, resistance, current and/or voltage at the heater 102, which are collectively referred to as input parameters. For example, the controller 104 is configured to operate the power converter 116 to adjust the input voltage based on the resistance of the heater 102 such that power from power converter 116 matches the change in the resistance of the heating elements of the heater 102. In another example, the controller 104 switches the control switch at a selected duty cycle to adjust the input voltage, where the duty cycle is directly proportional to a scaling factor. The controller 104 selects the duty cycle based on at least one of the load current and the detected voltage at the heater 102 or, more specifically, a temperature of the respective heating elements.

In one form of the present disclosure, the controller 104 uses a state mode control in which the controller 104 determines an operational state of the heater 102 based on one or more of the input parameters. The operational state of the heater 102 includes: idle mode in which no power is being supplied to the heater 102; start-up mode in which low power is being supplied to measure voltage and current; soft-start mode in which the power is increased at a low ramp rate until a specific resistance setpoint is passed; rate mode in which the temperature is increased at a ramp rate selected based on a material of the heater; hold mode in which temperature of the heater 102 is controlled to a specific setpoint using, for example, a continuous proportional-integral-derivative controller (PID control). These operation states are merely exemplary and could include other modes while remaining within the scope of the present disclosure.

Based on the operational mode of the heater 102, the controller 104 independently controls the heating elements by adjusting the input voltage applied to the heating elements from a respective power converter. The controller 104 can be configured in various ways to adjust the input voltage including but not limited to: (1) modifying PID parameters according to the operational state; (2) changing a mode that is automatic (no user input) to manual (user inputs received by controller) or changing a mode that is manual to automatic; (3) setting a manual percent power; (4) starting a ramp setpoint; (5) modifying an integral (holding term) of the PID control by offsetting the integral, scaling the integral, and/or making the modification based on temperature; and (6) changing voltage when a new operation state is entered. The logic used by the controller 104 for adjusting the voltage can be triggered in various suitable ways including but not limited to: (1) detecting start-up; (2) proximity of a process temperature to a setpoint; (3) deviation of the process temperature from the setpoint; (4) change in the setpoint; (5) exceeding the process temperature; (6) falling below the process temperature; (7) lapse of a predetermined time period; (8) a general system reading to be reached (e.g., current, voltage, wattage, resistance, and/or percent of power). The thermal system includes multiple states, where each state has unique settings to create a programmable state machine providing optimum performance in a dynamic system. Each state may define the next state that is entered when the condition is met.

The controller 104 is configured to operate the power converter system 106 to apply a continuously variable voltage to the heating elements of the heater 102. The variable voltage has different amplitudes of power. The heater 102 is less susceptible to thermal cracks by using variable voltage to control ramp rates, and thus the variable voltage is operable to reduce temperature differences between the different heating zones. Such benefits are further realized when the thermal system utilizes two-wire control.

In one form of the present disclosure, the controller 104 is configured to provide model-based control to match PID states to system states. A ramp-up rate and heater testing are based on the operational states of the heater. A typical control method for powering the heater 102 has potential issue of causing cracks in a ceramic substrate, particularly when the resistive heating element is made of a material having a relatively high thermal coefficient of resistance (TCR). During heater start-up, the resistive heating element has a relatively low resistance when cold, and the controller 104 of the present disclosure can manage low resistance cold start by limiting power and voltage, thereby inhibiting current-rush in. When a temperature of a respective heating zone is ramped up to a setpoint, a temperature difference between the respective zone and other zones is maintained within acceptable limits by adjusting ramp rates at the heater zones. Therefore, the power to the individual heating zones may be balanced. The ramp rate of the resistive heating elements may be controlled and adjusted by the controller in response to the operational states of the heating elements, thereby achieving a more uniform heating throughout the various heating zones.

FIGS. 7A, 7B, 7C, and 7D, illustrate example output voltage waveforms of a power converter that provides power to one or more heating elements of a heater during a start-up mode, a warm-up mode, a steady state mode, and at a disturbance, respectively. As shown, the voltage waveforms applied to the heating elements are different. The voltage varies depending on the resistance of the heating elements, the current flowing through the heating elements, and the temperature of the heating elements. During start-up and warm-up when the temperature is relatively low, the voltage has a relatively small amplitude and thus, the wattage is relatively low. During steady state and disturbance/surge when the temperature is relatively high, the amplitude of the voltage is increased resulting in higher wattage.

More particularly, with regard to start-up, the resistance of the heating elements is low (e.g. 3 ohms), and if the heating elements receive a full-line voltage (e.g., 208V), the instantaneous current flowing through the heating elements and the resulting power is significantly large (e.g., approx. 69 Å and 14,352 W). With the power converter system 106, the controller 104 adjusts the input voltage to the heating elements to a much lower voltage, e.g., 3V, to control the current and power (e.g., 1 Å and 3 W). The controller 104 may then gradually increase the voltage applied based on the resistance of the heating elements and feedback information.

Generally, different heating elements of a heater may not be heated at the same rate even though the same power supply is applied to the heating elements. This may be caused by various factors, such as positions of the heating elements relative to heat sinks and the manufacturing non-uniformity in the heating zones. When a significant temperature difference occurs between adjacent heating zones, a significant difference in thermal expansion in the adjacent heating zones may result in cracks in the ceramic substrate of the heating plate. The electronic thermal system of the present disclosure includes a power converter system that includes one or more power converters for providing varied power to the heating elements for a precise and safer control of the heating elements and thus, the heater. For example, lower power may be supplied to one or more heating elements to minimize peak current or may be provided at an early stage of the heating and during shutdown to prevent thermal cracks in the substrate of the heating plate. The controller controls the power converter system to output different voltages and thus, controls the temperature of the individual heating zones. Accordingly, the electrical thermal system of the present disclosure adjusts the temperature differences between different zones to provide uniform temperature throughout the heater.

Therefore, the controller controls variable power supply to the individual heating elements based on the temperature of the heating elements and/or the operational state of the heating elements. The variable power control method of the controller of the present disclosure may: 1) allow control of peak current and voltage; 2) size power drop for a maximum wattage delivered at highest setpoint, and not at startup in rush; 3) allow use of a signal phase to deliver desired power; 4) control startup at low voltage to allow for short circuit/shorted heater detection; 5) for two-wire controls, temperature measurements can be significantly more stable due to continuously stable sinusoidal conduction, thereby allowing more detailed diagnostics; and 6) set power factor at 1.0.

The controller can also measure/control heater characteristics, such as current, voltage, wattage, resistance, line frequency. The controller provides temperature control of individual heating zones and manages the temperature differences between different zones in order to provide uniform temperature throughout the heating plate to inhibit generation of thermal cracks.

With the power converter system, the controller is configured to control power supply from the power source to the heater. The power source may be an AC source with phase fire control or a DC source with a switching device, and the heating elements may be made of different materials with a wide range of resistances. For example, when molybdenum is used to form the heating element, the resistive heating element has very low resistance when cold and thus, draws relatively high currents. The power conversion technology of the present disclosure applies lower voltage to manage the current to an acceptable level during low resistance cold phase of warm up.

In addition, the controller also provides multiple supplementary and complementary sensing methods based on pedestal construction and application. For example, discrete temperature sensors such as thermocouples or RTDs (Resistance Temperature Detectors) may be used when placement/space allows. Optical florescent sensing may be used for a high plasma application, such as that disclosed in U.S. Pat. No. 9,625,923, which is commonly assigned with the present application and the contents of which are incorporated herein by reference in their entirety. Two-wire sensors, as set forth above, may also be employed. These temperature sensors may also be used for over temperature limiting, among other functions while remaining within the scope of the present disclosure.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A thermal system comprising:
a heater comprising a resistive heating element operable to emit heat and operable as a sensor; and
a control system comprising:
a power converter being a step-down voltage converter and including a power switch, wherein the power converter is electrically coupled to the heater and is operable to apply an output voltage that is adjustable to the resistive heating element;
a sensor circuit configured to measure at least one of a voltage and an electric current of the resistive heating element; and
a controller connected to the power converter and the sensor circuit, the controller being configured to determine the output voltage applied to the resistive heating element based on an input parameter and a desired setpoint, wherein the controller is configured to operate the power switch of the power converter to apply the output voltage applied to the resistive heating element, and the input parameter includes a temperature of the resistive heating element that is determined based on the at least one of the voltage and the electric current, and the desired setpoint is based on an operational state of the heater.

2. The thermal system according to claim 1, wherein the power converter includes a buck converter that includes the power switch.

3. The thermal system according to claim 1, wherein the controller further comprises electronics having a microprocessor.

4. The thermal system according to claim 1, wherein the power switch is a field effect transistor (FET).

5. The thermal system according to claim 1, wherein the controller is configured to scale an input voltage to the heater based on one or more limits.

6. The thermal system according to claim 5, wherein the one or more limits includes a sensed parameter value that includes at least one of voltage, current, and wattage.

7. The thermal system according to claim 1, wherein the controller is configured to scale an input voltage to the heater to a value less than full line voltage.

8. The thermal system according to claim 1, wherein the controller is configured to scale an input voltage to the heater between a preset minimum value and a preset maximum value.

9. The thermal system according to claim 1, wherein the controller is configured to scale an input voltage to the heater based on a control algorithm.

10. The thermal system according to claim 9, wherein the controller is configured to determine a resistance of the resistive heating element based on the at least one of the voltage and the electric current and scale the input voltage based on the resistance.

11. The thermal system according to claim 1, wherein the controller is configured to scale an input voltage to the heater to limit amount of voltage applied to the heater.

12. The thermal system according to claim 1 further comprising a plurality of the heaters and a plurality of the power converters such that each of the plurality of the heaters is controlled by one or more power converters from among the plurality of the power converters.

13. The thermal system according to claim 1, wherein the controller is configured to determine a resistance of the resistive heating element based on the at least one the voltage and the electric current and to execute diagnostics of the heater based on the resistance.

14. The thermal system according to claim 1, wherein the controller is configured to operate the power converter to adjust the output voltage based on a resistance of the heater such that power from the power converter is proportional to a change in the resistance of the heater.

15. The thermal system according to claim 1, wherein the controller is configured to switch the power switch at a selected duty cycle, and the duty cycle is directly proportional to a scaling factor.

16. The thermal system according to claim 1, wherein the controller is configured to determine the temperature of the heater based on the at least one the voltage and the electric current, and switches the power switch at a selected duty cycle that is based on the temperature of the heater.

17. The thermal system according to claim 1, wherein the desired setpoint includes a desired power to be applied to the heater.

18. The thermal system according to claim 1, wherein the sensor circuit is configured to measure the voltage and the electric current of the resistive heating element, and the controller is configured to calculate a resistance of the heater based on the voltage and the current, and determines the temperature of the heater based on the resistance, further wherein the controller is configured to determine the output voltage based on the temperature of the heater.

19. A thermal system comprising:
a heater having a plurality of resistive heating elements, wherein each of the resistive heating elements is operable to emit heat and operable as a sensor; and
a control system comprising:
a plurality of power converters, each of the plurality of power converters being a step-down voltage converter that includes a power switch, wherein a given power converter from among the plurality of power converters is electrically coupled to one or more resistive heating elements from among the plurality of resistive heating elements, wherein the given power converter is operable to apply an output voltage that is adjustable to the one or more resistive heating elements;

a plurality of sensor circuits, wherein each of the plurality of sensor circuits includes a current sense resistor, a given sensor circuit from among the plurality of sensor circuits is electrically coupled between the given power converter and the one or more resistive heating elements from among the plurality of resistive heating elements and the given sensor circuit is configured to measure at least one of a voltage and an electric current of the one or more resistive heating elements from among the plurality of resistive heating elements; and a controller connected to the plurality of power converters and the plurality of sensor circuits, wherein, for the given power converter, the controller is configured to determine the output voltage applied to the one or more resistive heating elements based on an input parameter and a desired setpoint and to operate the power switch of the given power converter to apply the output voltage to the one or more resistive heating elements, wherein the input parameter includes a temperature of the one or more resistive heating elements that is determined based on the at least one of the voltage and the electric current measured by the given sensor circuit, and the desired setpoint is based on an operational state of the heater.

20. The thermal system according to claim 19, wherein the controller is configured to calculate resistances of the plurality of resistive heating elements and determine the temperature of the heater based on the resistances of the plurality of resistive heating elements and adjust the temperature to compensate for a leakage current from the power switches.

21. The thermal system according to claim 19, wherein the controller is configured to determine the temperature of the heater based on the resistance, and the controller is configured to control the output voltage of one or more of the power converters from among the plurality of power converters based on the temperature of the heater.

* * * * *